United States Patent [19]
Mori et al.

[11] Patent Number: 5,309,197
[45] Date of Patent: May 3, 1994

[54] PROJECTION EXPOSURE APPARATUS

[75] Inventors: Tetsuya Mori, Yokohama; Akiyoshi Suzuki, Tokyo; Hideki Ina, Kawasaki, all of Japan

[73] Assignee: Canon Kabushiki Kaisha, Tokyo, Japan

[21] Appl. No.: 868,705

[22] Filed: Apr. 15, 1992

[30] Foreign Application Priority Data

Apr. 16, 1991 [JP] Japan .................................. 084023

[51] Int. Cl.5 ............................................ G03B 27/42
[52] U.S. Cl. ..................... 355/53; 356/400; 356/152
[58] Field of Search ................... 355/53; 356/400, 152

[56] References Cited
U.S. PATENT DOCUMENTS

| | | | |
|---|---|---|---|
| 4,780,615 | 10/1988 | Suzuki | 250/548 |
| 4,875,076 | 10/1989 | Torigoe | 355/53 |
| 4,901,109 | 2/1990 | Mitome et al. | 355/68 |
| 4,962,318 | 10/1990 | Nishi | 250/548 |

Primary Examiner—Monroe H. Hayes
Attorney, Agent, or Firm—Fitzpatrick, Cella, Harper & Scinto

[57] ABSTRACT

A projection exposure apparatus includes a projection lens system for projecting an image of a pattern of an original on a substrate having a photosensitive layer, by using a sensitizing beam; a first detection optical system for detecting a mark of the substrate through the projection lens system and with a first non-sensitizing beam, the first detection optical system producing first information related to the position of the mark; a second detection optical system for detecting the mark of the substrate without the projection lens system and with a second nonsensitizing beam having a bandwidth broader than that of the first non-sensitizing beam, the second detection optical system producing second information related to the position of the mark; and a detector for detecting an error included in the first information, by using the first and second information.

11 Claims, 4 Drawing Sheets

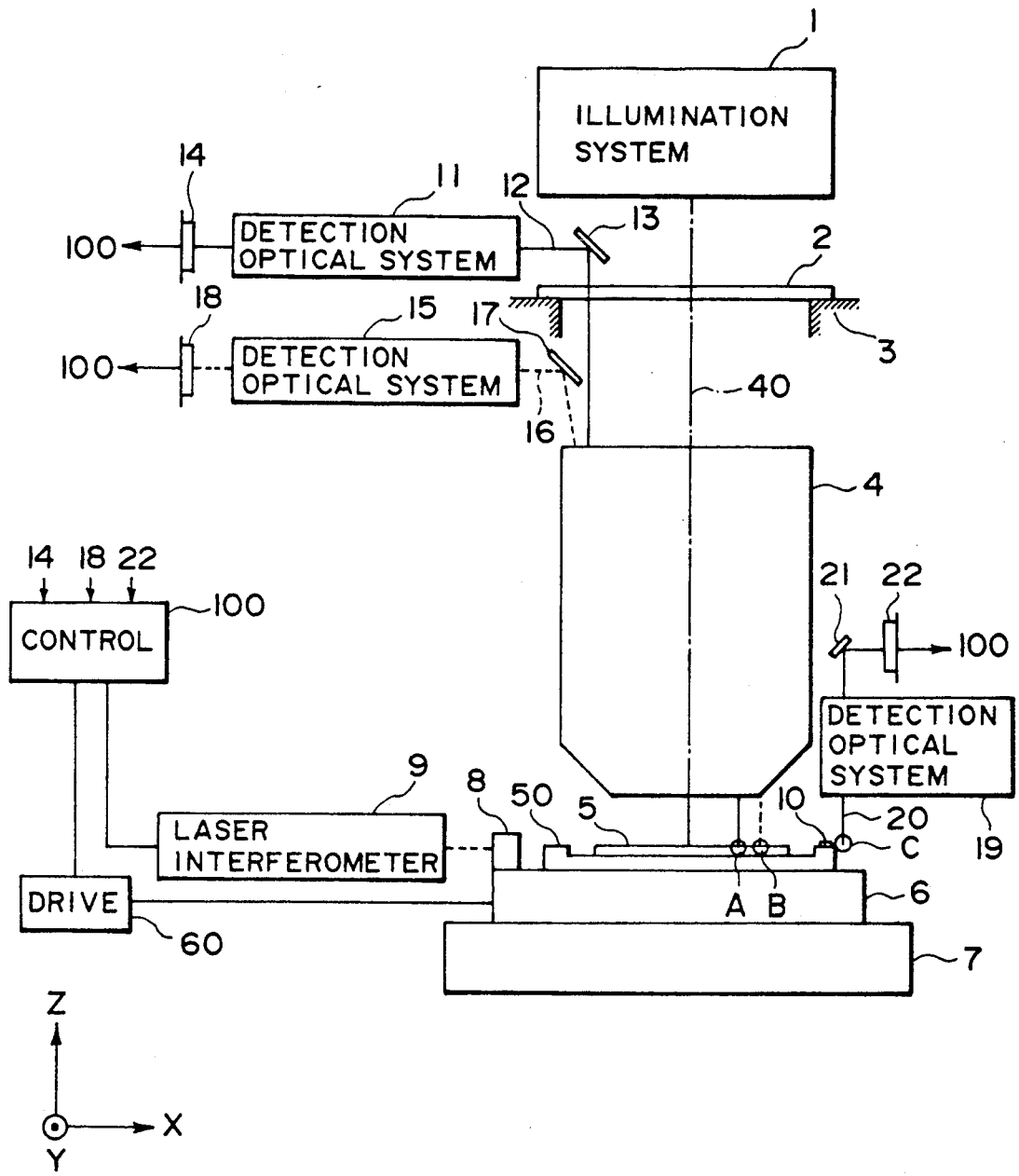
F I G. 1

PROJECTION EXPOSURE APPARATUS

FIELD OF THE INVENTION AND RELATED ART

This invention relates to a projection exposure apparatus and, more particularly, to a semiconductor device manufacturing projection exposure apparatus, called a "stepper", for use in manufacture of semiconductor devices wherein an image of a circuit pattern is projected by a projection lens system onto pattern regions of a wafer sequentially to thereby print the circuit pattern on the pattern regions of the wafer.

In a stepper, in order that an image of a circuit pattern of a reticle is projected on each pattern region of a wafer through a reduction projection lens system sequentially to thereby transfer (print) the image of the circuit pattern on each pattern region, it is necessary to accurately align each pattern region of the wafer with the reticle.

For this sake, the stepper is provided with an alignment scope for detecting alignment marks of a wafer to obtain positional information related to these marks and, on the basis of the positional information related to the alignment marks and obtained through the alignment scope, the position of the wafer with respect to the reticle is detected precisely such that each pattern region of the wafer can be aligned accurately with the reticle.

An example of such an alignment scope is a TTL (through-the-lens) on-axis alignment scope. This serves to form an image of an alignment mark of a reticle and an image of an alignment mark of a wafer, projected reversely on the reticle through the projection lens system, upon an image pickup device. On the basis of the positional relationship between these images of the alignment marks formed on the image pickup device, the position of the wafer with respect to the reticle can be determined.

The system using this alignment scope is advantageous because the positional relationship between the alignment marks of the reticle and the wafer can be observed directly. However, for the imaging of the alignment pattern of the wafer, it uses the same sensitizing light as used for the transfer of the circuit pattern image. Therefore, inconveniently there is a difficulty in enhancing the contrast of the image of the alignment mark, due to absorption of light by a resist of the wafer.

Another example of an alignment scope is an off-axis alignment scope disposed beside a projection lens system. It has an optical axis set at a position spaced from the optical axis of the projection lens system by a predetermined distance (base length), and it serves to form an image of an alignment mark of a wafer on an image pickup device, through its objective lens and with use of non-sensitizing light. Thus, there does not occur absorption of light by a resist (which is a problem in the TTL on-axis alignment scope), and it is possible to enhance the contrast of the alignment mark image.

Since however this type of alignment scope indirectly detects the position of the alignment mark of the wafer with respect to the reticle which is positioned with respect to the major assembly of the exposure apparatus, essentially there is a difficulty in enhancing the precision. Also, the distance between the projection lens system and the alignment scope is large, such that a change with time in the distance (base length) between the optical axes of the projection lens system and the alignment scope has a large effect on the position detection. Thus, the stability of precision of the position detection is low.

An improved alignment scope, by which the inconveniences of the TTL on-axis alignment scope and the off-axis alignment scope can be alleviated, has been proposed. This is a "TTL non-axis alignment scope" wherein an image of an alignment mark of a wafer is reversely projected on an image pickup device through a projection lens system and with non-sensitizing light.

Since in the system using such an alignment scope an alignment mark is imaged by using non-sensitizing light, there does not occur large absorption of light by a resist (which is a problem in the TTL on-axis alignment scope). Also, since it is possible to set the optical axis of the alignment scope closer to the optical axis of the projection lens system, as compared with the case of the off-axis alignment scope, a change with time in the distance (base length) between the optical axes of the projection lens system and the alignment scope does not cause large deterioration of the precision of position detection as compared with the case of the off-axis alignment scope.

However, in the system using such a TTL non-axis alignment scope, in order to reduce the effect of chromatic aberration of the projection lens system, there is a necessity of using non-sensitizing light of narrow bandwidth, similar to monochromatic light. This causes interference of lights reflected by top and bottom surfaces of a resist, covering an alignment mark of a wafer. Such interference in turn causes deterioration of the quality of the image of the alignment mark, and an error of detecting the position of the alignment mark results.

In order to avoid such error in the position detection when a TTL non-axis alignment scope is used, it is necessary to use non-sensitizing light of broad bandwidth and to use a chromatic aberration correcting optical system of improved performance, for the projection lens system. However, such a chromatic aberration correcting optical system is very expensive and, also, it is not easy to remove residual aberration sufficiently.

SUMMARY OF THE INVENTION

It is an object of the present invention to avoid the above-described inconveniences involved in a projection exposure apparatus.

Thus, in accordance with a first aspect of the present invention, there is provided a projection exposure apparatus, comprising: a projection lens system for projecting an image of a pattern of an original on a substrate having a photosensitive layer, by using a sensitizing beam; a first detection optical system for detecting a mark of the substrate through said projection lens system and with a first non-sensitizing beam, said first detection optical system producing first information related to the position of the mark; a second detection optical system for detecting the mark of the substrate without said projection lens system and with a second non-sensitizing beam having a bandwidth broader than that of the first non-sensitizing beam, said second detection optical system producing second information related to the position of the mark; and means for detecting an error included in the first information, by using the first and second information.

In accordance with a second aspect of the present invention, there is provided a projection exposure apparatus, comprising: holding means for holding a substrate having a photosensitive layer, said holding means having a portion on which a reference pattern is formed or to be formed; a projection lens system for projecting an image of a pattern of an original on the substrate, by using a sensitizing beam; driving means for moving said holding means along an image plane of said projection lens system; measuring means for measuring the amount of movement of said holding means along the image plane; a first detection optical system for detecting a mark of the substrate and the reference pattern, through said projection lens system and with a first non-sensitizing beam; a second detection optical system for detecting the mark of the substrate and the reference pattern, without said projection lens system and with a second non-sensitizing beam having a bandwidth broader than that of the first non-sensitizing beam; and control means for controlling the position of said holding means by using said measuring means and said driving means to allow detection of the mark and the reference pattern through said first and second detection optical systems, wherein said control means produces first distance information representing the distance between optical axes of said first and second detection optical systems by using said first and second detection optical systems and the reference pattern, wherein said control means produces second distance information representing the distance between the optical axes of said first and second detection optical systems by using said first and second detection optical systems and the mark, and wherein said control means determines an error in the detection of the position of the mark of the substrate through said first detection optical system, on the basis of a difference between the first and second distance information.

In accordance with a third aspect of the present invention, there is provided a projection exposure apparatus, comprising: holding means for holding a substrate having a photosensitive layer; a projection lens system for projecting an image of a pattern of an original on the substrate with a sensitizing beam to record the pattern on the photosensitive layer; driving means for moving said holding means along an image plane of said projection lens system; measuring means for measuring the amount of movement of said holding means along the image plane; a first detection optical system for detecting a mark of the substrate and the pattern recorded on the photosensitive layer, through said projection lens system and with a first non-sensitizing beam; a second detection optical system for detecting the mark of the substrate and the pattern recorded on the photosensitive layer, without said projection lens system and with a second non-sensitizing beam having a bandwidth broader than that of the first non-sensitizing beam; and control means for controlling the position of said holding means by using said measuring means and said driving means to allow detection of the mark of the substrate and the pattern recorded on the photosensitive layer, through said first and second detection optical systems, wherein said control means produces first distance information representing the positional relationship between the mark of the substrate and the pattern recorded on the photosensitive layer, by using said first detection optical system, wherein said control means produces second distance information representing the positional relationship between the mark of the substrate and the pattern recorded on the photosensitive layer, by using said second detection optical system, and wherein said control means determines an error in the detection of the position of the mark of the substrate through said first detection optical system, on the basis of a difference between the first and second distance information.

Further, in accordance with a fourth aspect of the present invention, there is provided a semiconductor device manufacturing method wherein the position of a mark of a wafer is detected through a projection lens system and, after adjustment of the wafer with respect to a mask, an image of a circuit pattern of the mask is projected and printed on the wafer through the projection lens system and with a sensitizing beam, the improvements residing in the steps of: detecting the mark through the projection lens system with a first non-sensitizing beam, whereby information related to the position of the mark is produced, and correcting the produced information with an offset value to determine the position of the mark, wherein the offset value is determined by using first information related to the position of the mark and produced by detecting a mark of a particular wafer through the projection lens system and with the first non-sensitizing beam and second information produced by detecting the mark of the particular wafer without the projection lens system and with a second non-sensitizing beam having a bandwidth broader than that of the first non-sensitizing beam.

A projection exposure apparatus according to a preferred embodiment of the present invention includes a projection lens system for projecting an image of a circuit pattern of a reticle with sensitizing light, an X-Y stage provided at the image plane side of the projection lens system and being movable along a plane intersecting substantially perpendicularly with the optical axis of the projection lens system, and a measuring device for measuring the position of the X-Y stage. The apparatus is further equipped with a first detection optical system (TTL non-axis alignment scope) for detecting an image of a first alignment mark of a first wafer disposed on the X-Y stage, through the projection lens system and with first non-sensitizing light; a second detection optical system (off-axis alignment scope) for detecting an image of the first alignment mark of the first wafer disposed on the X-Y stage, without the projection lens system and with second non-sensitizing light having a bandwidth broader than that of the first non-sensitizing light; and control means for correcting an error in obtaining positional information related to a second alignment mark of the first wafer and/or to an alignment mark of a second wafer placed on the X-Y stage to thereby control the movement of the X-Y stage, by using the first detection optical system and the measuring device on the basis of at least one of (i) positional information related to the first alignment mark and produced through the second detection optical system and the measuring device and (ii) intensity distribution information related to the first alignment mark. This makes it possible to correct the error attributable to the interference by a resist, caused in the system using a TTL on-axis alignment scope, by using an off-axis alignment scope which can be used also as a wafer prealignment scope, without modifying a TTL non-axis alignment scope to complicate the optical arrangement. Therefore, the wafer alignment precision can be enhanced significantly, without increasing the cost of the apparatus and without complicating the structure of the apparatus.

In accordance with an aspect of the present invention, there may be added a third detection optical system (TTL on-axis alignment scope) for detecting an image of an alignment pattern of the reticle with the sensitizing light and also for detecting an image of a reference mark provided on the X-Y stage, through the projection lens system. The reference mark may include at least one of a mark of a substrate fixedly provided on the X-Y stage and an alignment mark of a wafer placed on the X-Y stage.

Further, in the present invention, the relative position (base length) of the optical axis of the first detection optical system with respect to the optical axis of the projection lens system, upon the image plane, may be detected on the basis of (i) the positional information related to the reference mark and obtained through the first detection optical system and the measuring device and (ii) the positional information related to the reference mark and obtained through the third detection optical system and the measuring device; while the relative position (base length) of the optical axis of the second detection optical system with respect to the optical axis of the projection lens system, upon the image plane, may be detected on the basis of (iii) the positional information related to the reference mark and obtained through the second detection optical system and the measuring device and (iv) the positional information related to the reference mark and obtained through the third detection optical system and the measuring device.

Further, in the present invention, the X-Y stage may be provided with a photosensitive member for receiving and recording an image of an alignment pattern of the reticle, projected through the projection lens system and with the sensitizing light. On the basis of the positional information related to the pattern image recorded on the photosensitive member and produced through the first detection optical system and the measuring device, the control means may detect the relative position (base length) of the optical axis of the first detection optical system with respect to the optical axis of the projection lens system, upon the image plane. Also, on the basis of the positional information related to the pattern image recorded on the photosensitive member and produced through the second detection optical system and the measuring device, the control means may detect the relative position (base length) of the optical axis of the second detection optical system with respect to the optical axis of the projection lens system, upon the image plane.

The photosensitive member on the X-Y stage may be fixedly provided on the X-Y stage, or it may be placed on the X-Y stage as required and may be demounted from the X-Y stage after the measurement of the base length.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic view of an embodiment of the present invention.

FIGS. 2A-2E are schematic views for explaining the sequence of wafer alignment operation using the projection exposure apparatus of FIG. 1, wherein FIG. 2A shows the manner of detecting a stage reference mark by using a TTL on-axis alignment scope; FIG. 2B shows the manner of detecting the stage reference mark by using a TTL non-axis alignment scope; FIG. 2C shows the manner of detecting the stage reference mark by using an off-axis alignment scope; FIG. 2D shows the manner of detecting a wafer alignment mark by using the TTL non-axis alignment scope; and FIG. 2E shows the manner of detecting the wafer alignment mark by using the off-axis alignment scope.

FIGS. 3A-3E are schematic views of mark images and reference pattern images formed on a CCD, wherein FIG. 3A shows images of a reticle alignment mark and a stage reference mark as formed on a CCD 14 in the state of FIG. 2A; FIG. 3B shows images of the reference pattern and a stage reference mark as formed on a CCD 18 in the state of FIG. 2B; FIG. 3C shows images of the reference pattern and the stage reference mark as formed on a CCD 22 in the state of FIG. 2C; FIG. 3D shows images of the reference pattern and a wafer alignment mark as formed on the CCD 18 in the state of FIG. 2D; and FIG. 3E shows images of the reference pattern and the wafer alignment mark as formed on the CCD 22 in the state of FIG. 3E.

DESCRIPTION OF THE PREFERRED EMBODIMENTS

Figure 2A:
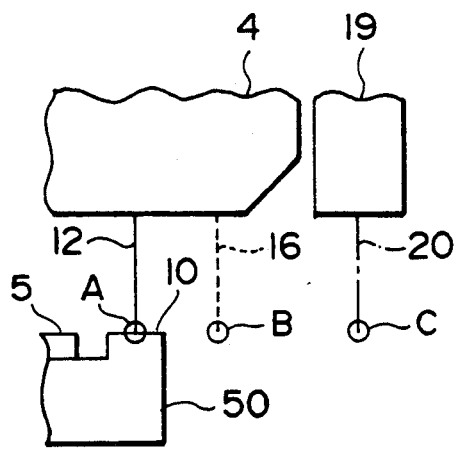

FIG. 1 is a schematic view of an embodiment of the present invention. In FIG. 1, denoted at 1 is an illumination system for emitting illumination light (sensitizing light) which comprises i-line or g-line light or KrF excimer laser light, for example. Denoted at 2 is a reticle on which a circuit pattern and a few kinds of alignment marks are formed. The illumination system 1 serves to illuminate the circuit pattern of the reticle 2 with the illumination light, with uniform illuminance. Denoted at 3 is a major assembly of the apparatus. The reticle 2 is supported by a movable reticle stage (not shown). By using the reticle stage, a reticle alignment scope (not shown) and a reticle setting alignment mark formed on the reticle, the reticle is aligned with the major assembly 3 and is fixed thereto. Denoted at 4 is a reduction projection lens system for projecting an image of the circuit pattern of the reticle illuminated by the illumination system 1 and an image of an alignment mark of the reticle 2 as illuminated by a TTL on-axis alignment scope, to be described later. Denoted at 5 is a wafer which has an array of pattern regions and alignment marks, formed on scribe lines adjoining the pattern regions, and which is covered with a resist. An image of the circuit pattern of the reticle 2 is projected onto each pattern region sequentially whereby the circuit pattern is transferred to the resist in each pattern region. Denoted at 6 is a wafer stage which is placed on a base plate 7, for translational (horizontal) motion and rotational motion along a direction (vertical) of an optical axis 40 of the projection lens system 4 and along a plane (X-Y plane) perpendicular to the optical axis 40. Disposed on and held by the wafer stage 6 is a wafer chuck 50 for attracting and holding the wafer 5 thereon. Also, an optical mirror 8 for measurement of the amount of movement of the stage, is mounted on and fixed to the wafer stage 6. Denoted at 9 is a laser interferometer which serves to project laser light to the optical mirror 8. By photoelectrically converting interference light produced as a result of interference of the reflected light from the optical mirror 8 and reference light, prepared separately, the laser interferometer produces a signal corresponding to the position of the wafer stage 6. The combination of the optical mirror 8 and the laser interferometer 9 is provided to detect the position of the wafer stage 6 in the lateral direction as viewed in the drawing, and there is provided an additional combination of optical mirror and laser interferometer (not shown) for detection of the position of the wafer stage 6 in the vertical direction as viewed in the drawing. Further, while not shown in the drawing, a surface position detecting sensor is provided to detect the position of the wafer 5 surface in the direction of the optical axis 40. By moving the wafer stage 6 along the optical axis 40 on the basis of the sensing by this sensor, the wafer 5 surface can be positioned on the image plane of the projection lens system 4. Denoted at 10 is a stage reference mark formed on a glass substrate which is fixed to the wafer chuck 50. The glass substrate is so set that the stage reference mark 10 is positioned at the same level of the image plane of the projection lens system 4. Denoted at 60 is a stage driving device for moving the wafer stage 6 in a desired direction by a desired amount.

Denoted at 11-14 are components of a TTL on-axis alignment scope, denoted at 15-18 are components of a TTL non-axis alignment scope and denoted at 19-22 are components of an off-axis alignment scope. These alignment scopes have their optical axes disposed parallel to each other and are used to detect the positions of alignment marks or patterns in the X or Y direction.

The TTL on-axis alignment scope is provided between the reticle 2 and the illumination system 1, and it includes a detection optical system 11, a deflecting mirror 13 and a CCD 14 and has an optical axis 12. An unshown objective lens and a mirror 13 of the detection optical system 11 are movable as a unit along the reticle 2, and they can be retracted to a position not blocking the illumination light from the illumination system 1. The optical axis 12 extends through the projection lens system 4 and intersects perpendicularly with the image plane of the projection lens system 4 at a portion adjacent to a zone A illustrated.

The detection optical system 11 serves to project sensitizing light, of the same wavelength as the sensitizing light used for the projection of the circuit pattern image, to the mirror 13 and the light reflected by the mirror 13 illuminates the reticle 2. The projection lens system 4 receives the sensitizing light passing through the reticle 2 and projects it toward the zone A of the image plane. If, in the neighborhood of the zone A, there is a reflective substrate such as the wafer 5 or a reference mark 10, the projected sensitizing light is reflected by it. The projection lens system 4 receives the reflected sensitizing light and directs the same to the reticle 2. The reflected sensitizing light, illuminating and passing through the reticle 2, is reflected by the mirror 13 and, through the detection optical system 11, it impinges on a CCD 14. By this, an image of the reticle 2 or an image of the reflective substrate in the zone A is formed on the CCD 14. Thus, by this CCD 14, an image of an alignment mark of the reticle 2 and an image of an alignment mark of the wafer 5 as well as an image of the reference mark 10 can be detected.

The TTL non-axis alignment scope is provided between the reticle 2 and the projection lens system 4. It includes a detection optical system 15, a deflecting mirror 17 and a CCD 18, and it has an optical axis 16. The mirror 17 is fixed and is disposed at a position not intercepting the imaging light from various patterns of the reticle 2, directed to the projection lens system 4. The optical axis 6 extends through the projection lens system 4 and intersects perpendicularly with the image plane of the projection lens system in a portion adjacent to a zone B illustrated.

The detection optical system 15 serves to project non-sensitizing light, of a wavelength different from that of the sensitizing light used for the projection of the circuit pattern image, to the mirror 17, by which the light is reflected to the projection lens system 4. The projection lens system receives this non-sensitizing light and directs the same to a portion adjacent to the zone B of the image plane. If, in the neighborhood of the zone B, there is a reflective substrate such as the wafer 5 or the reference mark 10, the non-sensitizing light is reflected by it. The projection lens system 4 receives the reflected non-sensitizing light and directs the same to the mirror 17. The reflected non-sensitizing light is reflected by the mirror 17 and, through the detection optical system 15, it is received by the CCD 18. By this, an image of the reflective substrate in the zone B is formed on the CCD 18. Thus, by this CCD 18, an image of an alignment mark of the wafer 5 or an image of the reference mark 10 can be detected. Further, this alignment scope is provided so as to produce a signal representing the positional relationship between the image of each mark and a certain reference, placed in a fixed relationship with the major assembly 3 of the apparatus and, to this end, a reference may be electrically defined on the CCD 18 or, alternatively, a reference plate having a reference pattern formed thereon may be disposed on the optical axis such that the reference pattern can be imaged on the CCD 18 simultaneously with or separately from the imaging of the marks.

The off-axis alignment scope is disposed beside the projection lens system 4, and it includes a detection optical system 19, a deflecting mirror 21 and a CCD 22 and has an optical axis 20. The optical axis 20 intersects perpendicularly with a plane, containing the image plane of the projection lens system 4, at a portion adjacent to a zone C illustrated.

The detection optical system 19 serves to project non-sensitizing light (e.g. white light), having a wavelength different from that of the sensitizing light used for the projection of the circuit pattern image and having a bandwidth broader than that of the light used in the TTL non-axis alignment scope, to a portion adjacent to the zone C. If, in the neighborhood of the zone C, there is a reflective substrate such as the wafer 5 or the reference mark 10, the projected non-sensitizing light is reflected thereby. The detection optical system 19 receives the reflected non-sensitizing light and directs the same to the mirror 21. The reflected non-sensitizing light is reflected by the mirror 21 and impinges on the CCD 22, by which an image of the reflective substrate in the zone C is formed on the CCD 22. Thus, by the CCD 22, an image of an alignment mark of the wafer 5 or an image of the reference mark 10 can be detected. Further, also this alignment scope is provided so as to produce a signal representing the positional relationship between the image of each mark and a certain reference which is in a fixed relationship wi&h the major assembly 3 of the apparatus and, to this end, a reference may be electrically defined on the CCD 22 or, alternatively, a reference plate having a reference pattern formed thereon may be disposed within the optical system 19 such that the reference pattern can be imaged on the CCD 22 simultaneously with or separately from the imaging of the marks.

Video signals outputted from these three types of alignment scopes and representing intensity distributions of mark images or reference pattern images, are supplied to a control means 100 and are processed therein. The control means 100 is electrically communicated with the X-direction laser interferometer 9, a Y-direction laser interferometer (not shown) and the stage driving means 60, through respective signal lines, such that, on one hand, the output signals representing the position (amount of movement) of the stage 6 with respect to the X and Y directions are applied to the control means, while on the other hand, it produces and applies a control signal, designating the amount of movement of the stage 6, to the driving means 60.

Referring now to FIGS. 2 and 3 as well as FIG. 1, the process of aligning the wafer 5 with the reticle 2 and of projecting and transferring an image of the circuit pattern of the reticle 2 on each pattern region of the wafer 5, in the projection exposure apparatus of the present invention, for manufacture of semiconductor devices, will be explained.

First, the reticle 2 is supported by the unshown reticle stage and is brought into alignment with respect to the major assembly 3. After this, the reticle stage and, thus, the reticle 2 are fixed to the major assembly 3. By this, the center of the circuit pattern of the reticle 2 is brought into coincidence with the optical axis 40 of the projection lens system.

Figure 3A:
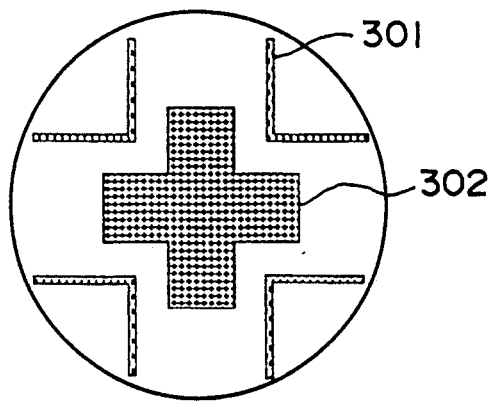

Then, the driving means 60 moves the wafer stage 6 so as to position the reference mark 10 in the zone A as illustrated in FIG. 2A. In this state, the TTL on-axis alignment scope (11-14) is used to detect images of an alignment mark of the reticle 2 and the reference mark 10, and the detected images are converted into video signals. The relationship between them upon the CCD is such as shown in FIG. 3A. In FIG. 3A, numeral 301 denotes the image of the alignment mark of the reticle 2, while numeral 302 denotes the image of the reference mark. On the basis of the video signals from the CCD 14, the control means 100 calculates positional deviation of the mark image 302 with reference to the mark image 301, in the directions corresponding to the X and Y directions. Thus, a positional deviation $\Delta Ax$ in the X direction and a positional deviation $\Delta Ay$ in the Y direction, of the reference mark 10 with reference to the alignment mark of the reticle 2 in the state of FIG. 2A, can be detected. Since the position of the alignment mark of the reticle 2 with respect to the optical axis 40 of the projection lens system 4 is predetermined, on the basis of this detection it is possible to determine the position (X-Y coordinates) of the reference mark 10.

Figure 2B:
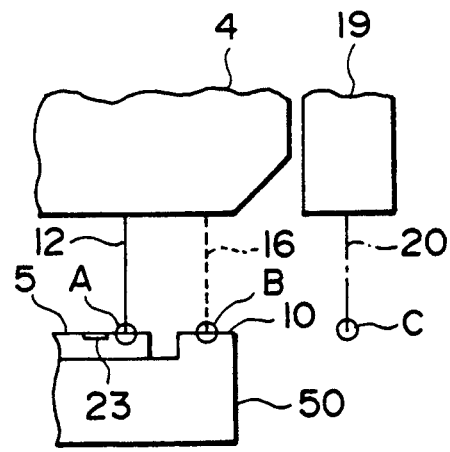
Figure 3B:
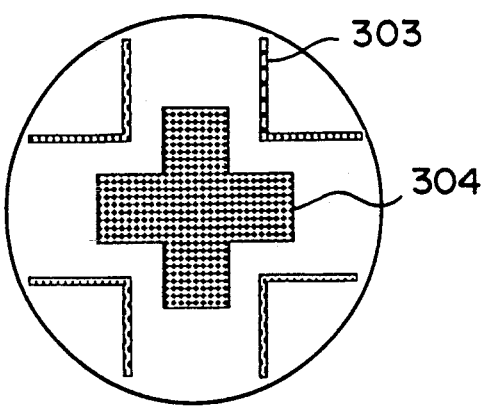

Subsequently, the driving means 60 moves the wafer stage 6 from the FIG. 2A position, so as to position the reference mark 10 in the zone B as illustrated in FIG. 2B. At this time, the control means 100 calculates the movement amounts $\Delta Labx$ and $\Delta Laby$ of the wafer stage 6 in the X and Y directions, on the basis of the outputs of the X-direction laser interferometer 9 and the Y-direction laser interferometer. In the state shown in FIG. 2B, the TTL non-axis alignment scope (15-18) is used to detect images of the reference mark 10 and a reference pattern (setting mark) within the alignment scope. The relationship of them upon the CCD 18 at this time is such as shown in FIG. 3B. In FIG. 3B, numeral 303 denotes the image of the reference pattern and numeral 304 denotes the image of the reference mark. On the basis of the video signals from the CCD 18, the control means calculates positional deviation in the X and Y directions of the mark image 304 with respect to the mark image 303, and it detects a positional deviation $\Delta Bx$ in the X direction and a positional deviation $\Delta By$ in the Y direction, of the reference mark 10 with respect to the reference pattern (setting mark), in the state of FIG. 2B.

On the basis of the thus detected quantities $\Delta Ax$, $\Delta Bx$, $\Delta Labx$, $\Delta Ay$, $\Delta By$ and $\Delta Laby$, the control means 100 calculates the distance $\Delta Xabx$ ($=\Delta Labx + \Delta Ax - \Delta Bx$) in the X direction between the optical axis 12 of the TTL on-axis alignment scope and the optical axis 16 of the TTL non-axis alignment scope as well as the distance $\Delta Xaby$ ($=\Delta Laby + \Delta Ay - \Delta By$) of them in the Y direction, in the neighborhood of the image plane of the projection lens system as shown in FIGS. 2A and 2B. The calculated distances are memorized into a RAM (random access memory) of the control means 100. Since the distance between the optical axes 12 and 40 of the TTL on-axis alignment scope and the projection lens system 4 is predetermined, from the quantity $\Delta Xab$ it is possible to detect the distances in the X and Y axis alignment scope to the optical axis 40, namely, the base lengths BL1x and BL1y (first base line) of this alignment scope.

Figure 2C:
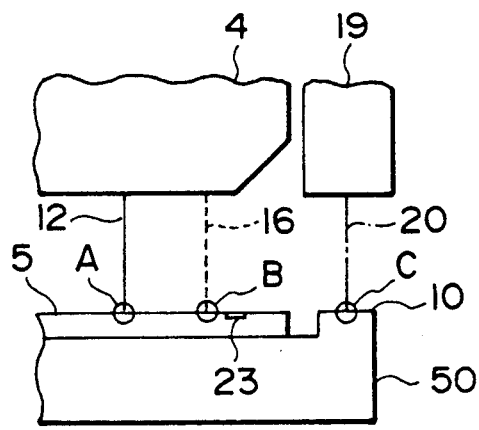
Figure 3C:
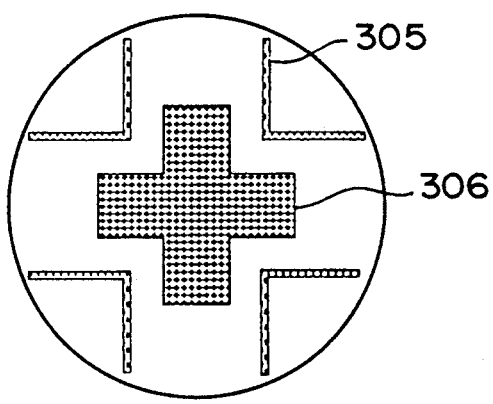

Thereafter, the driving means 60 moves the wafer stage 6 from the FIG. 2B position so as to position the reference mark 10 in the zone C as illustrated in FIG. 2C. At this time, the control means 100 calculates the movement amounts $\Delta Lbcx$ and $\Delta Lbcy$ of the wafer stage 6 in the X and Y directions, on the basis of the outputs of the X-direction laser interferometer 9 and the Y-direction laser interferometer. In the state shown in FIG. 2C, the off-axis alignment scope (19-22) is used to detect images of the reference mark 10 and a reference pattern (setting mark) within the alignment scope. The relationship of them upon the CCD 22 at this time is such as shown in FIG. 3C. In FIG. 3C, numeral 305 denotes the image of the reference pattern and numeral 306 denotes the image of the reference mark. On the basis of the video signals from the CCD 22, the control means calculates positional deviation in the X and Y directions of the mark image 306 with respect to the mark image 305, and it detects a positional deviation $\Delta Cx$ in the X direction and a positional deviation $\Delta Cy$ in the Y direction, of the reference mark 10 with respect to the reference pattern (setting mark), in the state of FIG. 2C.

On the basis of the thus detected quantities $\Delta Bx$, $\Delta Cx$, $\Delta Lbcx$, $\Delta By$, $\Delta Cy$ and $\Delta Lbcy$, the control means 100 calculates the distance $\Delta Xbcx$ ($=\Delta Lbcx + \Delta Bx - \Delta Cx$) in the X direction between the optical axis 16 of the TTL non-axis alignment scope and the optical axis 20 of the off-axis alignment scope as well as the distance $\Delta Xbcy$ ($=\Delta Lbcy + \Delta By - \Delta Cy$) of them in the Y direction, in the neighborhood of the image plane of the projection lens system as shown in FIGS. 2A-2C. The calculated distances are memorized into the RAM of the control means 100. Since the distances between the optical axes 16 and 40 of the TTL non-axis alignment scope and the projection lens system 4 in the X and Y directions are predetermined, as base lengths BL1x and BL1y, from the quantities $\Delta Xbcx$ and $\Delta Xbcy$ it is possible to detect the distances in the X and Y directions from the optical axis 20 of the off-axis alignment scope to the optical axis 40, namely, the base lengths BL2x and BL2y (second base line) of this alignment scope.

After the measurement for the detection of the interdistances $\Delta Xabx$, $\Delta Xaby$, $\Delta Xbcx$ and $\Delta Xbcy$ of the optical axes is completed, detection of an image of an alignment mark of the wafer 5 is then executed.

Figure 2D:
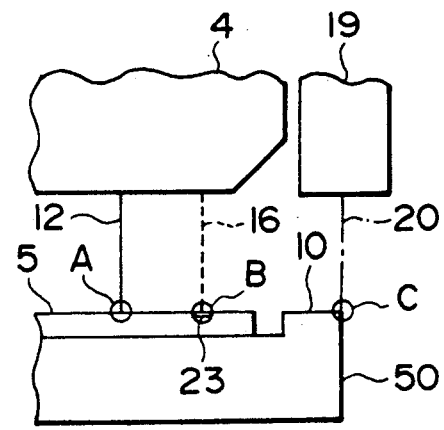
Figure 3D:
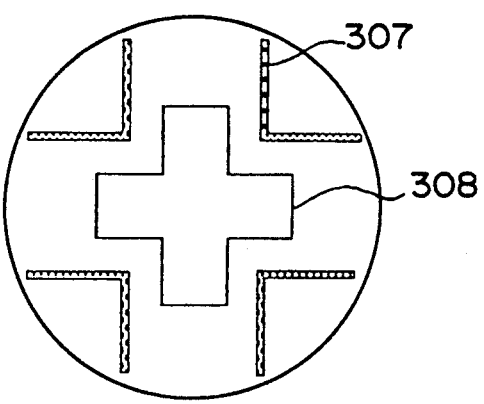

The driving means 60 moves the wafer stage 6 so as to position an alignment mark 23 of the wafer 5 in the zone B as illustrated in FIG. 2D. In the state of FIG. 2D, the TTL non-axis alignment scope (15-18) is used to detect images of the alignment mark 23 and a reference pattern (setting mark) within the alignment scope. The relationship of them upon the CCD 18 at this time is such as shown in FIG. 3D. In FIG. 3D, numeral 307 denotes the image of the reference pattern and numeral 308 denotes the image of the alignment mark 23. On the basis of the video signals from the CCD 18, the control means 100 calculates positional deviation in the X and Y directions of the mark image 308 with respect to the mark image 307, and it detects a positional deviation $\Delta WBx$ in the X direction and a positional deviation $\Delta WBy$ in the Y direction, of the alignment mark 23 with respect to the reference pattern (setting mark), in the state of FIG. 2D.

Usually, if the interdistances $\Delta Xabx$ and $\Delta Xaby$ of the optical axes (base lengths BL1x and BL1y) and the positional deviations $\Delta WBx$ and $\Delta WBy$ are determined, the wafer 2 can be brought to a position just below the projection lens system 4 and aligned thereto by moving the wafer stage 6 through the stage driving means 60 from the FIG. 2D position. However, as described in the introductory portion of this Specification, the results $\Delta WBx$ and $\Delta WBy$ of detection of the position of the alignment mark 23 of the wafer 5 through the TTL non-axis alignment scope have been influenced by the interference caused by the resist and the residual aberration of the projection lens system and, therefore, the precision of detection is not very high. In the present embodiment, in consideration of this, prior to moving the alignment mark into the zone B shown in FIG. 2D, the alignment mark 23 is moved into the zone C shown in FIG. 2E and the image of the mark is detected.

Figure 2E:
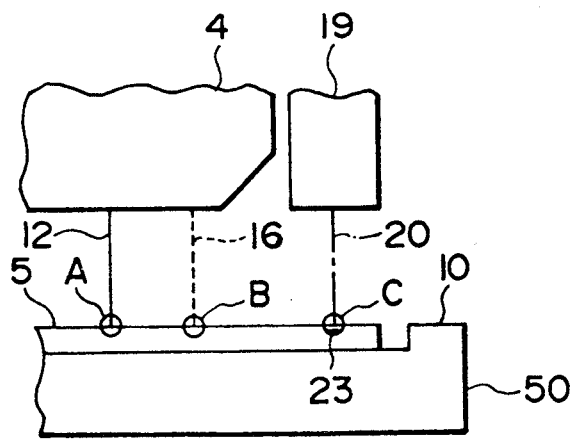
Figure 3E:
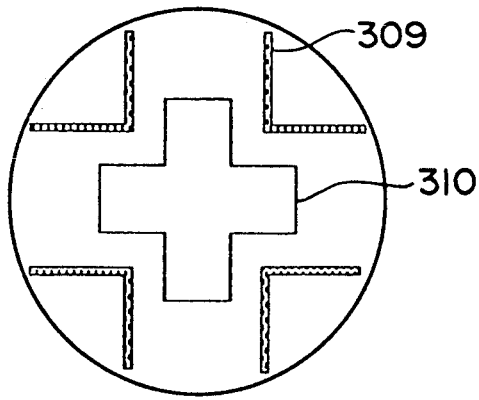

More specifically, under the control of the control means 100, the driving means 60 moves the wafer stage 6 from the FIG. 2C position so as to position the alignment mark 23 in the zone C as illustrated in FIG. 2E. At this time, the control means 100 calculates the movement amounts $\Delta mx$ and $\Delta my$ of the wafer stage 6 in the X and Y directions, on the basis of the outputs of the X-direction laser interferometer 9 and the Y-direction laser interferometer. In the state shown in FIG. 2E, the off-axis alignment scope (19-22) is used to detect, with non-sensitizing white light of broad bandwidth, the images of the alignment mark 23 and a reference pattern (setting mark) within the alignment scope. The relationship of them upon the CCD 22 at this time is such as shown in FIG. 3E. In FIG. 3E, numeral 309 denotes the image of the reference pattern and numeral 310 denotes the image of the reference mark. On the basis of the video signals from the CCD 22, the control means 100 calculates positional deviation in the X and Y directions of the mark image 310 with respect to the mark image 309 and, on the basis of the positional deviations, it determines a positional deviation $\Delta WCx$ in the X direction and a positional deviation $\Delta WCy$ in the Y direction, of the alignment mark 23 with respect to the reference pattern (setting mark), in the state of FIG. 2E.

The detection optical system 19 of the off-axis alignment scope is an optical system which is strictly aberration-corrected with respect to white light in order to assure that images of marks such as alignment marks are formed sharply. Also, the white light has a broad bandwidth and has low coherency. Therefore, there occurs substantially no effect of interference and residual aberration, as in the case of the TTL non-axis alignment scope. Thus, the quantities $\Delta WCx$ and $\Delta WCy$ of positional deviation of the alignment mark detected through the off-axis alignment scope has a high precision.

Then, in the present embodiment, while monitoring the output of the laser interferometer 9, the wafer stage 6 is moved by the driving means 60 from the FIG. 2E position by $\Delta mx$ and $\Delta my$ in the X direction, to thereby position the alignment mark of the wafer 5 in the zone B as illustrated in FIG. 2D. In the state of FIG. 2D, the TTL non-axis alignment scope is used to detect the positional deviations $\Delta WBx$ and $\Delta WBy$ of the alignment mark 23 with respect to the reference pattern (setting mark) of the TTL non-axis alignment scope, as described hereinbefore. Thereafter, on the basis of the quantities $\Delta WCx$, $\Delta WCy$, $\Delta WBx$, $\Delta WBy$, $\Delta mx'$ and $\Delta my'$, the control means 100 again calculates the distances $\Delta XBCx$ ($=\Delta mx' + \Delta WBx - \Delta WCx$) and $\Delta XBCy$ ($=\Delta my' + \Delta WBy - \Delta WCy$) between the optical axes 16 and 20 in the X and Y directions. If the quantities detected before this calculation are correct, then the interdistances $\Delta Xbcx$ and $\Delta Xbcy$ of the optical axes detected by using the reference mark 10 and the interdistances $\Delta XBCx$ and $\Delta XBCy$ of the optical axes detected by using the alignment mark 23 should be in the relationship of $\Delta XBCx = \Delta Xbcx$ and $\Delta XBCy = \Delta Xbcy$. Actually, however, due to an error in the quantity $\Delta WB$ influenced by the interference and the residual aberration of the TTL non-axis alignment scope, there are produced errors $\Delta\Delta x$ and $\Delta\Delta y$ wherein $\Delta\epsilon x = \Delta XBCx - \Delta Xbcx$ and $\Delta\epsilon y = \Delta XBCy - \Delta Xbcy$. Namely, the errors $\Delta\epsilon x$ and $\Delta\epsilon y$ are those errors caused in the detection of the alignment mark 23 through the TTL non-axis alignment scope.

In consideration of this, in the present embodiment, the quantity $\Delta WB$ of positional deviation of the alignment mark 23 with respect to the reference pattern (setting mark) within the TTL non-axis alignment scope is corrected by offset quantities $\Delta\epsilon x$ and $\Delta\epsilon y$, and the quantities $\Delta WBx'$ ($=\Delta WBx - \Delta\epsilon x$) and $\Delta WBy'$ ($=\Delta WBY - \Delta\epsilon y$) are used as the positional deviations. Thus, by using correct positional deviations $\Delta WBx'$ and $\Delta WBy'$ as well as the base lengths BL1x and BL1y, the wafer stage 6 is moved by the driving means 60 through an appropriate distance. By this, each pattern region of the wafer 5 can be positioned with respect to the reticle with good precision and thus the circuit pattern image can be correctly projected on each pattern region. This ensures printing of the circuit pattern image accurately on each pattern region and, thus, assures production of semiconductor devices of good quality.

It is to be noted here that in the present embodiment, as for the alignment mark to be detected through the TTL non-axis alignment scope, an alignment mark provided in relation to only one of the pattern regions arrayed on the wafer 5 may be detected or, alternatively, alignment marks provided in relation to some pattern regions may be detected. As a further alternative, alignment marks provided in relation to all the pattern region 5 may be detected. Particularly, if alignment marks provided in relation to some pattern regions which are separate from each other are detected and their positional deviations are detected, then an error of the wafer as a whole in a rotational direction or any distortion of the wafer can be detected. Further, if plural alignment marks provided in relation to a particular pattern region are detected and their positional deviations are detected, an error of that pattern region in the rotational direction or any distortion or the like of that pattern region can be detected. Such error or distortion can be corrected when each pattern region of the wafer 5 is sequentially brought into alignment with the reticle 2. When all the alignment marks are to be detected, the operation of positional deviation detection and position adjustment is effected sequentially with respect to every pattern region (this is called "die-by-die alignment").

As for the alignment mark 23 of the wafer 5 to be used for the determination of the offset $\Delta\epsilon$, any one of alignment marks provided in relation to the pattern regions of the wafer may be used. As a matter of course, plural alignment marks may be used.

As for the reference mark 10 used in the detection of interdistance of the optical axes, a plurality of such reference marks may be provided at different positions on the wafer chuck 50 of the wafer stage 6. On that occasion, by detecting these marks through the alignment scope, not only detection of interdistance of the optical axes in the X direction but also correction of base length (base line) in relation to multiple points (which may be called "base grating"), including the drive orthogonality of the wafer stage 6, are assured.

When the offset $\Delta\epsilon$ can be considered as an inherent error in the detection of alignment marks of wafers having been processed through a particular process or processes, a single offset may be applied to those wafers having been processed through the same process or processes. This means that, for each process, use of only a single wafer is sufficient for determination of the offset $\Delta\epsilon$ of the TTL non-axis alignment scope.

In the present embodiment, one TTL non-axis alignment scope is provided and, by using this alignment scope, the positional deviations of the alignment mark of the wafer 5 with respect to the X and Y directions is detected. However, a pair of TTL non-axis alignment scopes may be provided and used in relation to the X and Y directions, separately. On that occasion, only one off-axis alignment scope may be used or, alternatively, two off-axis alignment scopes may be used in relation to the X and Y directions separately.

As for the sensitizing light to be used with the TTL on-axis alignment scope, the light produced by the illumination system 1 may be used. Alternatively, light from a separate light source may be used.

The light used with the off-axis alignment scope is not limited to white light. Any other non-sensitizing light of broad bandwidth in a certain wavelength region may be used.

The light to be used in the TTL non-axis alignment scope may be supplied from a laser or a combination of a lamp and an interference filter.

As for the device for picking up the image of a mark or a reference pattern, in place of a CCD, an image pickup tube may be used as an example.

While the TTL non-axis alignment scope is disposed between the reticle 2 and the projection lens system 4, it may be disposed between the reticle 2 and the illumination system 1. On that occasion, the structure may be modified to detect the alignment mark of the reticle together with the alignment mark of the wafer.

The shape or structure of the alignment mark or the reference pattern is not limited to the one shown in FIGS. 3A-3E. Any other shape or structure such as, for example, a grating type mark may be used.

Also, the structure of the alignment scope may be changed in accordance with the arrangement of the exposure apparatus.

The projection lens system is not limited to one which is provided only by a lens assembly. The present invention is applicable also to an apparatus having a projection optical system comprising a combination of lenses and mirrors.

In the present embodiment, the offset $\Delta\epsilon$ is determined on the basis of detection of positional deviation of the alignment mark 23 through the off-axis alignment scope to correct an error in the detection of positional deviation of the alignment mark through the TTL non-axis alignment scope. This is only an example. That is, as another example, the information related to the intensity distribution as represented by a video signal obtained through the off-axis alignment scope and related to the image of the alignment mark 23 may be memorized into the RAM of the control means as a reference pattern to be used in the detection of positional deviation based on the pattern matching method which is known per se. When the alignment mark of the wafer 5 is to be detected through the TTL non-axis alignment scope, the position of the image of the alignment mark of the wafer upon the CCD may be determined on the basis of the pattern matching with the memorized reference pattern, to determine any positional deviation of the mark image position. This assures high-precision detection of the wafer 5 position.

If in the present embodiment the error $\Delta\epsilon$ in the position detection through the TTL non-axis alignment scope is very large or if the position detection itself is unattainable, use of the TTL non-axis alignment scope may be omitted and the off-axis alignment scope may be used to detect the positional deviation of the alignment mark of the wafer 5. On the basis of the detected positional deviation and the interdistances $\Delta Xabx$, $\Delta Xaby$, $\Delta Xbcx$ and $\Delta Xbcy$ of the optical axes, the wafer 5 may be fed to a portion just below the projection lens system 4 for alignment of a pattern region of the wafer 5 with the reticle 2. In the alignment operation using a conventional off-axis alignment scope, such wafer feeding needs long distance movement of the wafer, resulting in low stability of alignment precision. In the present embodiment, however, such wafer feeding distance is divided into two interdistances $\Delta Xabx$ and $\Delta Xaby$ (BL1x and BL1y); $\Delta Xbcx$ and $\Delta Xbcy$ of optical axes, that is, the quantities $\Delta Xabx$ and $\Delta Xaby$ having relatively high stability and the quantities $\Delta Xbcx$ and $\Delta Xbcy$ of low stability. While, as in the alignment operation using the conventional off-axis alignment scope, the quantity $\Delta Xbc$ should be measured at suitable timing and should be corrected, it is shorter than that in the conventional off-axis alignment scope and, therefore, it is possible to increase the alignment precision of the wafer 5.

In the present embodiment, the stage reference mark 10 is used to detect the interdistances $\Delta Xabx$, $\Delta Xaby$, $\Delta Xbcx$ and $\Delta Xbcy$ of the optical axes as well as the base lines BL1x, BL1y, BL2x and BL2y, there is a possible method which does not use this reference mark. That is, in this method, a photosensitive material is provided on the wafer stage, and an image of a mark such as an alignment mark of the reticle 2 is printed on this photosensitive material, the printed mark image being used as a reference for the detection of the interdistance of the optical axes. When a resist applied to the wafer 5 of this embodiment or a resist applied to a separate wafer is used as this photosensitive material, the mark image is printed on the resist as a latent image and this image is detected without development. On the other hand, a photochromic material or a magneto-optic recording material may be used as the photosensitive material. When such a material is used, a substrate to which this material is applied may be provided on a portion of the wafer chuck 50, separate from the portion on which a wafer is to be placed. Alternatively, such a material may be applied to a wafer and the wafer may be placed on the wafer stage 6 only when the interdistance of the optical axes is to be detected. In any case, the mark image may be recorded on the photochromic material as a contrast image or on the magneto-optic recording material as a magnetic image. If, for the detection of the interdistance of optical axes, the photosensitive material is placed on the portion on which the wafer 5 is to be placed, it is assured that an image of a mark is detected at the site at which an alignment mark of the wafer 5 is to be actually detected. This is effective particularly when the orthogonality or magnification (size) changes with the position on the wafer stage 6. In the method using such a photosensitive material, as an example, in the apparatus shown in FIG. 1 a mark formed on the reticle 2 may be illuminated through the TTL on-axis alignment scope and an image of the mark may be projected on the photosensitive material through the projection lens system 4, to record the mark image on the photosensitive material. The subsequent operations may be similar to those of the embodiment described hereinbefore and, as shown in FIGS. 2B and 2C, while monitoring the amount of movement of the wafer stage 6, the TTL non-axis alignment scope and the off-axis alignment scope may be used to detect the positional deviation of the mark image recorded on the photosensitive material and, on the basis of the detected quantities, the interdistance of optical axes may be determined. The manner of determining the offset $\Delta\epsilon$ for the detection of positional deviation through the TTL non-axis alignment scope, by using the alignment mark 23 of the wafer 5 and the TTL non-axis alignment scope as well as the off-axis alignment scope, may be the same as that in the present embodiment.

Figure 4:
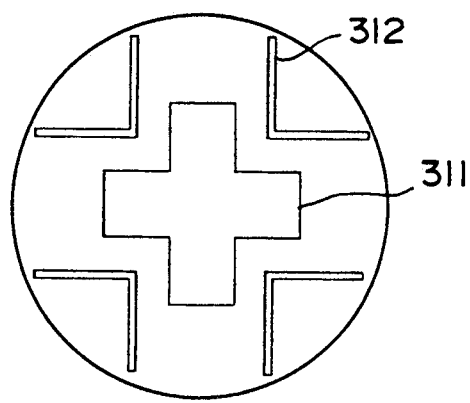
FIG. 4 is a schematic view showing a wafer alignment mark and a latent image of a reticle mark as recorded on a resist.

Referring now to FIGS. 1 and 4, another example of determining offset quantities $\Delta\epsilon x$ and $\Delta\epsilon y$ for the detection of positional deviation through the TTL non-axis alignment scope, where a resist is used as the photosensitive material, will be explained.

It is now assumed that the interdistances $\Delta Xabx$, $\Delta Xaby$, $\Delta Xbcx$ and $\Delta Xbcy$ have already been determined in accordance with any one of the methods described hereinbefore and that the wafer has an alignment mark formed on a scribe line while the reticle has a mark formed in a region (reticle scribe line) corresponding to the wafer scribe line. Initially, the mark of the reticle 2 is illuminated by using the TTL on-axis alignment scope, and an image of the reticle 2 mark is projected on a portion adjacent to the alignment mark of the wafer 5 whereby the reticle mark image is recorded thereon as a latent image. FIG. 4 shows &he alignment mark 311 of the wafer 5 and the latent image 312. As shown in FIG. 4, the alignment mark 311 and the latent image 312 are juxtaposed and, therefore, they can be detected at the same time (through the same view field) by any one of the alignment scopes. Then, the wafer driving means 60 moves the wafer stage 6 by $\Delta Xabx$ and $\Delta Xaby$ to bring the alignment mark 311 and the latent image 312 into the view field of the TTL non-axis alignment scope. Then, through this TTL non-axis alignment scope, images of the alignment mark 311 and the latent image 312 are formed on the CCD 18. The control means 100 receives a video signal outputted from the CCD 18 and corresponding to the images of the alignment mark 311 and the latent image 312 and, based on these video signals, it calculates the positional deviations $\Delta Mx$ and $\Delta My$ of the alignment marks 311 and the latent image 312 with respect to the X and Y directions. Subsequently, by using the wafer driving means 60 and the laser interferometer 9, the wafer stage 6 is moved from the position of detection of the images of the alignment mark 311 and the latent image 312, through the interdistances $\Delta Xbcx$ and $\Delta Xbcy$ of optical axes, whereby the alignment mark 311 and the latent image 312 are brought into the view field of the off-axis alignment scope. Then, through this off-axis alignment scope, the images of the alignment mark 311 and the latent image 312 are formed on the CCD 22. The control means 100 receives a video signal outputted from the CCD 22 and corresponding to the images of the alignment mark 311 and the latent image 312 and, on the basis of the received signal, it calculates the positional deviations $\Delta Nx$ and $\Delta Ny$ of the alignment mark 311 and the latent image 312 in the X and Y directions.

Since the latent image 312 is an image formed on the resist of the wafer 5, the error in the position detection through the TTL non-axis alignment scope or through the off-axis alignment scope is small. However, as described hereinbefore, the error in the detection of position of the alignment mark 311 of the wafer 5 through the TTL non-axis alignment scope is large. In consideration of this, the control means 100 determines errors $\Delta\epsilon x$ and $\Delta\epsilon y$ in the position detection through the TTL non-axis alignment scope on the basis of the difference between the quantities $\Delta Mx$ and $\Delta Nx$ and the difference between the quantities $\Delta My$ and $\Delta Ny$. More specifically, if there is no error in the detection using these alignment scopes, the relationships $\Delta Mx = \Delta Nx$ and $\Delta My = \Delta Ny$ should be satisfied. Actually, however, $\Delta Mx \neq \Delta Nx$ and $\Delta My \neq \Delta Ny$. This is because of an error in the position detection using the TTL non-axis alignment scope (the error in the detection using the off-axis alignment scope is small). Then, the control means 100 determines detection errors $\Delta\epsilon x$ and $\Delta\epsilon y$ wherein $\Delta\epsilon x = \Delta Mx - \Delta Nx$ and $\Delta\epsilon y = \Delta My - \Delta Ny$. Thus, the quantities $\Delta\epsilon x$ and $\Delta\epsilon y$ are used as offset quantities for the wafer alignment operation with respect to the reticle 2 through the TTL non-axis alignment scope. In this manner, the alignment and exposure operation is executed whereby an image of the circuit pattern can be correctly superposed upon and printed on the pattern region of the wafer.

A notable point of this embodiment resides in that strict precision of reticle alignment is not required when the reticle is fixed to the major assembly 3 of the apparatus. Only required is that the initial positional relationship of the reticle 2 and the wafer 3 is so detectable as to allow that the image of the mark of the reticle is projected in the neighborhood of the alignment mark 311 on the scribe line of the wafer to record the latent image 312. However, once the latent image 312 is recorded, the position of the reticle 2 should be maintained fixed.

As described hereinbefore, in this embodiment, on the basis of detection of an image of an alignment mark through an off-axis alignment scope, an error in the detection of positional deviation of the alignment mark through a TTL non-axis alignment scope is corrected and, thereafter, the wafer is aligned with respect to the reticle. This assures accurate wafer alignment through the TTL non-axis alignment scope without complicating the apparatus and without increasing the cost, and the image of a circuit pattern can be projected and printed correctly on each pattern region of a wafer. Thus, production of semiconductor devices of good quality is ensured.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus, comprising:
    holding means for holding a substrate having a photosensitive layer, said holding means having a portion on which a reference pattern is formed or to be formed;
    a projection lens system for projecting an image of a pattern of an original on the substrate, by using a sensitizing beam;
    driving means for moving said holding means along an image plane of said projection lens system;
    measuring means for measuring the amount of movement of said holding means along the image plane;
    a first detection optical system for detecting a mark of the substrate and the reference pattern, through said projection lens system and with a first non-sensitizing beam;
    a second detection optical system for detecting the mark of the substrate and the reference pattern, without said projection lens system and with a second non-sensitizing beam having a bandwidth broader than that of the first non-sensitizing beam; and
    control means for controlling the position of said holding means by using said measuring means and said driving means to allow detection of the mark and the reference pattern through said first and second detection optical systems, wherein said control means produces first distance information representing the distance between optical axes of said first and second detection optical systems by using said first and second detection optical systems and the reference pattern, said control means produces second distance information representing the distance between the optical axes of said first and second detection optical systems by using said first and second detection optical systems and the mark, and said control means determines an error in the detection of the position of the mark of the substrate through said first detection optical system, on the basis of a difference between the first and second distance information.

2. An apparatus according to claim 1, wherein said holding means comprises a recording member provided in a portion different from a portion on which the substrate is held, and an image of an alignment pattern of the original is projected and recorded on said recording member by said projection lens system and with the sensitizing beam, by which the reference pattern is formed on said holding means.

3. An apparatus according to claim 1, wherein said recording member includes one of a magneto-optical recording material and a photochromic material.

4. An apparatus according to claim 1, wherein said holding means has a mark formed in a portion different from a portion on which the substrate is held, such that the mark formed on said holding means serves as the reference pattern.

5. An apparatus according to claim 1, wherein an image of an alignment pattern of the original is projected and recorded on the photosensitive layer of the substrate through said projection lens system and with the sensitizing beam, by which the reference pattern is formed on said holding means.

6. An apparatus according to claim 5, wherein the photosensitive layer of the substrate includes one of a magneto-optical recording material and a photochromic material.

7. An apparatus according to claim 5, wherein the photosensitive layer of the substrate includes a resist.

8. An apparatus according to claim 1, wherein said first and second detection optical systems comprises first and second image pickup means for taking images of the mark and the reference pattern, and wherein the first and second information are produced by using the images of the mark and the reference pattern formed through said first and second detection optical systems, respectively.

9. A projection exposure apparatus, comprising:
    holding means for holding a substrate having a photosensitive layer;
    a projection lens system for projecting an image of a pattern of an original on the substrate with a sensitizing beam to record the pattern on the photosensitive layer;
    driving means for moving said holding means along an image plane of said projection lens system;
    measuring means for measuring the amount of movement of said holding means along the image plane;
    a first detection optical system for detecting a mark of the substrate and the pattern recorded on the photosensitive layer, through said projection lens system and with a first non-sensitizing beam;
    a second detection optical system for detecting the mark of the substrate and the pattern recorded on the photosensitive layer, without said projection lens system and with a second non-sensitizing beam having a bandwidth broader than that of the first non-sensitizing beam; and
    control means for controlling the position of said holding means by using said measuring means and said driving means to allow detection of the mark of the substrate and the pattern recorded on the photosensitive layer, through said first and second detection optical systems, wherein said control means produces first distance information representing the positional relationship between the mark of the substrate and the pattern recorded on the photosensitive layer, by using said first detection optical system, said control means produces second distance information representing the positional relationship between the mark of the substrate and the pattern recorded on the photosensitive layer, by using said second detection optical system, and said control means determines an error in the detection of the position of the mark of the substrate through said first detection optical system, on the basis of a difference between the first and second distance information.

10. An apparatus according to claim 9, wherein said first and second detection optical systems comprise first and second image pickup means for taking images of the mark of the substrate and the pattern recorded on the photosensitive layer, and wherein the first and second information are produced by using the images of the mark and the pattern recorded on the photosensitive layer, formed through said first and second detection optical systems, respectively.

11. In a semiconductor device manufacturing method usable with a first detection optical system for detecting through a projection lens the position of a mark of a wafer with a first non-sensitizing beam and a second detection optical system for detecting without the projection lens the position of the mark of the wafer with a second non-sensitizing beam having a bandwidth broader than that of the first non-sensitizing beam, wherein, after the wafer is brought into alignment with a mask on the basis of the detection of the mark of the wafer by using one of the first and second detection optical systems, a circuit pattern of the mask is projected onto the wafer through the projection lens, the improvement comprising the steps of:

detecting a reference mark provided on means for holding the wafer, by using the first and second detection optical systems to produce first distance information related to the distance between first and second optical axes;

detecting the mark of the wafer by using the first and second detection optical systems to produce second distance information related to the distance between the first and second optical axes;

detecting the mark of the wafer by using the first detection optical system to produce information related to the position of the mark of the wafer;

determining an offset on the basis of a difference between the first distance information and the second distance information; and correcting, with the offset, the information related to the position of the mark of the wafer to determine the position of the mark of the wafer.

* * * * *

UNITED STATES PATENT AND TRADEMARK OFFICE
CERTIFICATE OF CORRECTION

PATENT NO. : 5,309,197
DATED : May 3, 1994
INVENTOR(S) : TETSUYA MORI, ET AL.

It is certified that error appears in the above-indentified patent and that said Letters Patent is hereby corrected as shown below:

ON THE COVER PAGE:
Item [56] References Cited:
UNDER "FOREIGN APPLICATION PRIORITY DATA"

"Apr. 16, 1991 [JP] Japan ...... 084023" should read --Apr. 16, 1991 [JP] Japan ...... 3-084023--.

COLUMN 8:

Line 63, "wi&h" should read --with--.

COLUMN 12:

Line 34, "$\Delta\Delta x$" should read --$\Delta\epsilon x$-- and "$\Delta\Delta y$" should read --$\Delta\epsilon y$--; and
Line 45, "$(=\Delta WBY-\Delta\epsilon y)$" should read --$(=\Delta WBy-\Delta\epsilon y)$--.

COLUMN 17:

Line 66, "claim 1," should read --claim 2,--; and
Line 67, "includes" should read --comprises--.

UNITED STATES PATENT AND TRADEMARK OFFICE
CERTIFICATE OF CORRECTION

PATENT NO. : 5,309,197

DATED : May 3, 1994

INVENTOR(S) : TETSUYA MORI, ET AL.

It is certified that error appears in the above-indentified patent and that said Letters Patent is hereby corrected as shown below:

<u>COLUMN 18</u>:

Line 19, "comprises" should read --comprise--.

Signed and Sealed this

Twenty-second Day of November, 1994

Attest:

BRUCE LEHMAN

Attesting Officer

Commissioner of Patents and Trademarks